United States Patent
Shimizu et al.

(10) Patent No.: US 9,805,781 B2
(45) Date of Patent: *Oct. 31, 2017

(54) SEMICONDUCTOR MEMORY DEVICE

(71) Applicants: KABUSHIKI KAISHA TOSHIBA, Minato-ku, Tokyo (JP); SK hynix Inc., Iceheon-si, Gyeonggi-do (KR)

(72) Inventors: Naoki Shimizu, Seoul (KR); Ji Hyae Bae, Icheon-si (KR)

(73) Assignees: KABUSHIKI KAISHA TOSHIBA, Tokyo (JP); SK HYNIX INC., Icheon-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/365,358

(22) Filed: Nov. 30, 2016

(65) Prior Publication Data

US 2017/0084325 A1 Mar. 23, 2017

Related U.S. Application Data

(63) Continuation of application No. 14/864,271, filed on Sep. 24, 2015, now Pat. No. 9,530,480, which is a (Continued)

(51) Int. Cl.
*G11C 11/16* (2006.01)
*G11C 13/00* (2006.01)
(Continued)

(52) U.S. Cl.
CPC ............ *G11C 11/1693* (2013.01); *G11C 7/22* (2013.01); *G11C 7/222* (2013.01); *G11C 8/18* (2013.01);
(Continued)

(58) Field of Classification Search
CPC ....... G11C 11/1693; G11C 7/22; G11C 7/222; G11C 8/18; G11C 11/1653;
(Continued)

(56) References Cited

U.S. PATENT DOCUMENTS 5,748,553 A 5/1998 Kitamura
6,125,064 A 9/2000 Kim et al.
(Continued)

FOREIGN PATENT DOCUMENTS

JP 2003263891 A 9/2003
JP 2007200555 A 8/2007
WO 2008109772 A1 9/2008

OTHER PUBLICATIONS

International Preliminary Report on Patentability (IPRP) including Written Opinion (in English) dated Mar. 17, 2016, issued in International Application No. PCT/JP2014/070417.
(Continued)

*Primary Examiner* — Ly D Pham
(74) *Attorney, Agent, or Firm* — Holtz, Holtz & Volek PC

(57) ABSTRACT

A method of controlling a magnetoresistive random access memory includes receiving first signals associated with an active state through command/address pins; then receiving second signals associated with column and row addresses for a read operation, through the command/address pins, and in response reading data from a memory cell according to the row address; receiving third signals associated with column and row addresses for a write operation through the command/address pins, while reading the data; outputting the read data to data input/output pins, according to the column address for the read operation, after a lapse of a read latency; inputting data through the data input/output pins, in response to the third signals, according to the column address for the write operation, after a lapse of a write latency; and writing the data inputted from the data input/output pins to a memory cell according to the row address for the write operation.

14 Claims, 23 Drawing Sheets

Related U.S. Application Data continuation of application No. 14/201,686, filed on Mar. 7, 2014, now Pat. No. 9,171,600.

(60) Provisional application No. 61/873,800, filed on Sep. 4, 2013.

(51) Int. Cl.
| | | |
|---|---|---|
| *G11C 7/22* | (2006.01) | |
| *G11C 8/18* | (2006.01) | |
| *G11C 11/4076* | (2006.01) | |
| *G11C 11/56* | (2006.01) | |
| *G11C 11/419* | (2006.01) | |
| *G11C 7/08* | (2006.01) | |
| *G11C 7/10* | (2006.01) | |
| *G11C 8/16* | (2006.01) | |

(52) U.S. Cl.
CPC ...... *G11C 11/1653* (2013.01); *G11C 11/1673* (2013.01); *G11C 11/1675* (2013.01); *G11C 13/004* (2013.01); *G11C 13/0023* (2013.01); *G11C 13/0061* (2013.01); *G11C 13/0069* (2013.01); *G11C 7/08* (2013.01); *G11C 7/109* (2013.01); *G11C 8/16* (2013.01); *G11C 11/4076* (2013.01); *G11C 11/419* (2013.01); *G11C 11/5607* (2013.01)

(58) Field of Classification Search
CPC ............ G11C 11/1673; G11C 11/1675; G11C 13/0023; G11C 13/004; G11C 13/0061; G11C 13/0069; G11C 7/08; G11C 7/109; G11C 8/16; G11C 11/4076; G11C 11/419; G11C 11/5607

USPC .................................. 365/158, 191, 193, 194
See application file for complete search history.

(56) References Cited

U.S. PATENT DOCUMENTS

| | | | |
|---|---|---|---|
| 9,530,480 B2* | 12/2016 | Shimizu | ............... G11C 11/1653 |
| 2003/0090307 A1 | 5/2003 | Shin et al. | |
| 2004/0081013 A1 | 4/2004 | Lee et al. | |
| 2006/0145894 A1 | 7/2006 | Kim et al. | |
| 2007/0085587 A1 | 4/2007 | Lee et al. | |
| 2010/0054058 A1 | 3/2010 | Bringivijayaraghavan et al. | |
| 2010/0157702 A1 | 6/2010 | Seo | |
| 2010/0157717 A1 | 6/2010 | Lee et al. | |
| 2011/0161581 A1 | 6/2011 | Shin et al. | |
| 2011/0193609 A1 | 8/2011 | Lin et al. | |
| 2011/0291712 A1 | 12/2011 | Tobita | |
| 2012/0120754 A1 | 5/2012 | Fujisawa et al. | |
| 2012/0254650 A1 | 10/2012 | Park | |

OTHER PUBLICATIONS

International Search Report (ISR) and Written Opinion (WO) dated Sep. 16, 2014 issued in International Application No. PCT/JP2014/070417.

Taiwanese Office Action (and English translation thereof) dated Dec. 24, 2015, issued in counterpart Taiwanese Application No. 103130635.

Russian Office Action (and English translation thereof) dated Jun. 9, 2017, issued in counterpart Russian Application No. 2016107392/08.

* cited by examiner

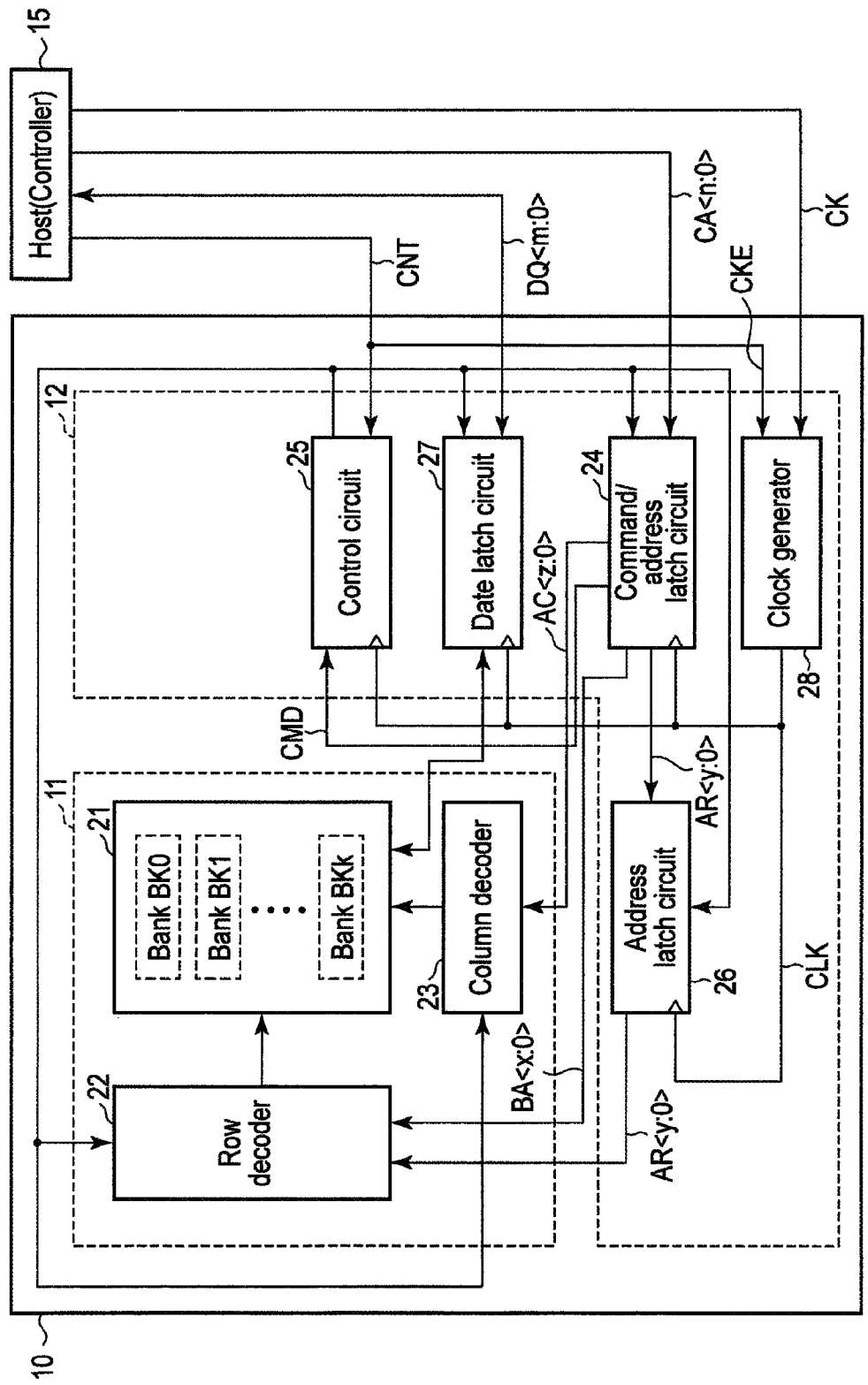
F I G. 2

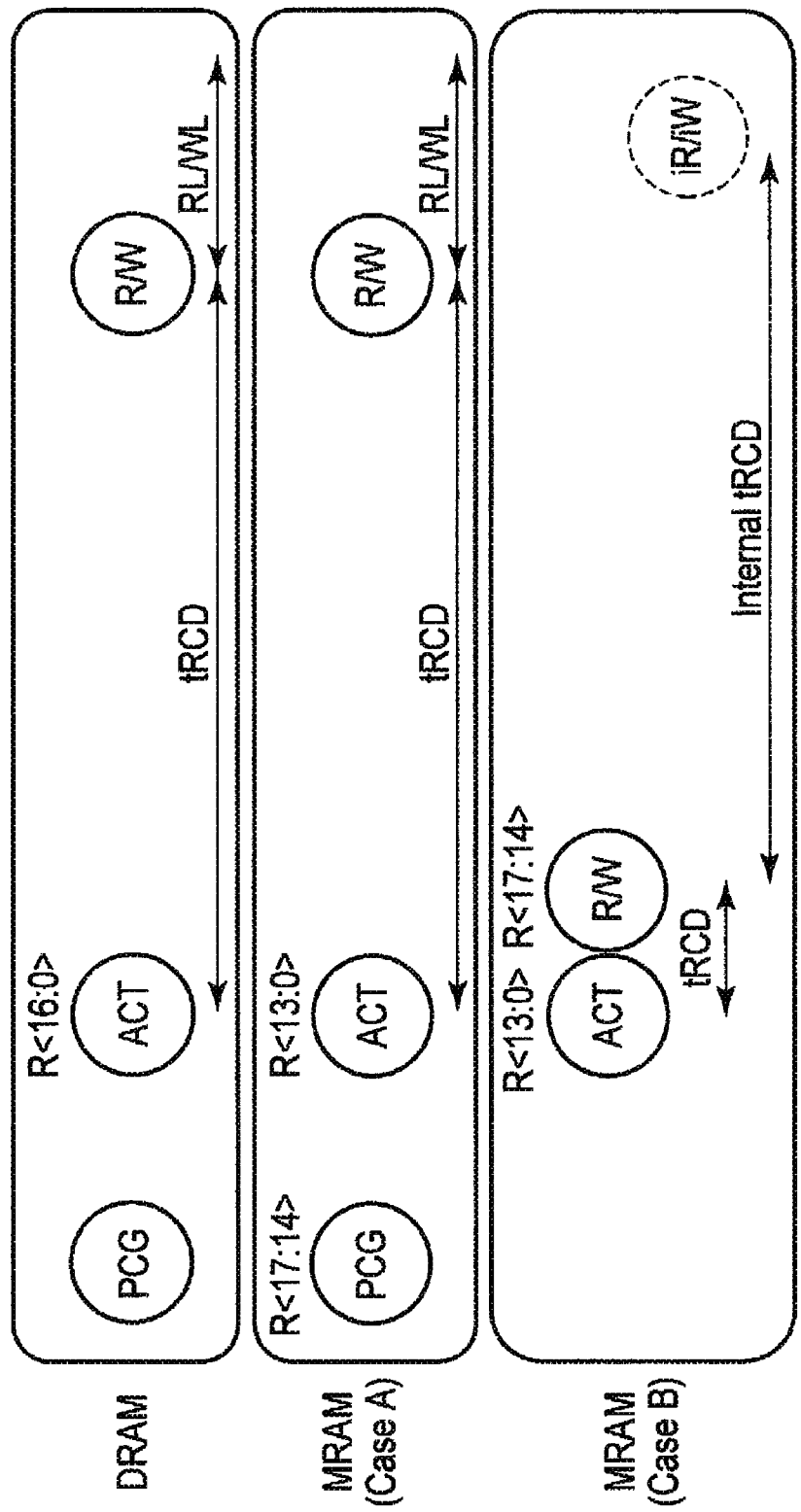
F I G. 4

| MR2OP | DRAM | | Case A (PCG-ACT) | | Case B (ACT-R/W) | |
|---|---|---|---|---|---|---|
| | RL | WL | RL | WL | RL | WL |
| 0001B | 3 | 1 | 3 | 2 | 9 | 7 |
| 0010B | 4 | 2 | 4 | 2 | 10 | 9 |
| 0011B | 5 | 2 | 5 | 2 | 13 | 12 |
| 0100B | 6 | 3 | 5 | 3 | 16 | 14 |
| 0101B | 7 | 4 | 6 | 3 | 19 | 17 |
| 0110B | 8 | 4 | 7 | 4 | 22 | 20 |
| 0111B | — | — | 8 | 4 | 25 | 23 |

Internal tRCD + case A's latency

FIG. 5

| MR2OP | DRAM | | Case A (PCG-ACT) | | Case B (ACT - R/W) | | Case A - Case B (GAP) | |
|---|---|---|---|---|---|---|---|---|
| | RL | WL | RL | WL | RL | WL | RL | WL |
| 0001B | 3 | 1 | 3 | 2 | 9 | 7 | -6 | -5 |
| 0010B | 4 | 2 | 4 | 2 | 10 | 9 | -6 | -7 |
| 0011B | 5 | 2 | 5 | 2 | 13 | 12 | -8 | -10 |
| 0100B | 6 | 3 | 5 | 3 | 16 | 14 | -11 | -11 |
| 0101B | 7 | 4 | 6 | 3 | 19 | 17 | -13 | -14 |
| 0110B | 8 | 4 | 7 | 4 | 22 | 20 | -15 | -16 |
| 0111B | - | - | 8 | 4 | 25 | 23 | -17 | -19 | internal tRCD for case B

| Case A | | Case B | | GAP_RL | GAP_WL | R2W | W2R | Frequency |
| --- | --- | --- | --- | --- | --- | --- | --- | --- |
| RL | WL | RL | WL | | | | | |
| 3 | 2 | 9 | 7 | -6 | -5 | 6 | 7 | 333 |
| 4 | 2 | 10 | 9 | -6 | -7 | 6 | 7 | 400 |
| 5 | 2 | 13 | 12 | -8 | -10 | 6 | 7 | 533 |
| 5 | 3 | 16 | 14 | -11 | -11 | 7 | 8 | 667 |
| 6 | 3 | 19 | 17 | -13 | -14 | 8 | 9 | 800 |
| 7 | 4 | 22 | 20 | -15 | -16 | 8 | 10 | 933 |
| 8 | 4 | 25 | 23 | -17 | -19 | 8 | 11 | 1066 |

F I G. 15

| tCK | tDQSCKmax/tCK(cycle) | tWTR(cycle) |
| --- | --- | --- |
| 6 | 1 | 2 |
| 5 | 2 | 2 |
| 3.75 | 2 | 2 |
| 3 | 2 | 3 |
| 2.5 | 3 | 3 |
| 2.15 | 3 | 4 |
| 1.875 | 3 | 4 |

F I G. 16

| OFFSET | WTRDB | |
| --- | --- | --- |
| | min | max |
| 8 | -1 | 5 |
| 6 | 1 | 5 |
| 5 | 4 | 7 |
| 8 | 4 | 10 |
| 8 | 6 | 12 |
| 9 | 7 | 14 |
| 9 | 9 | 16 |

F I G. 17

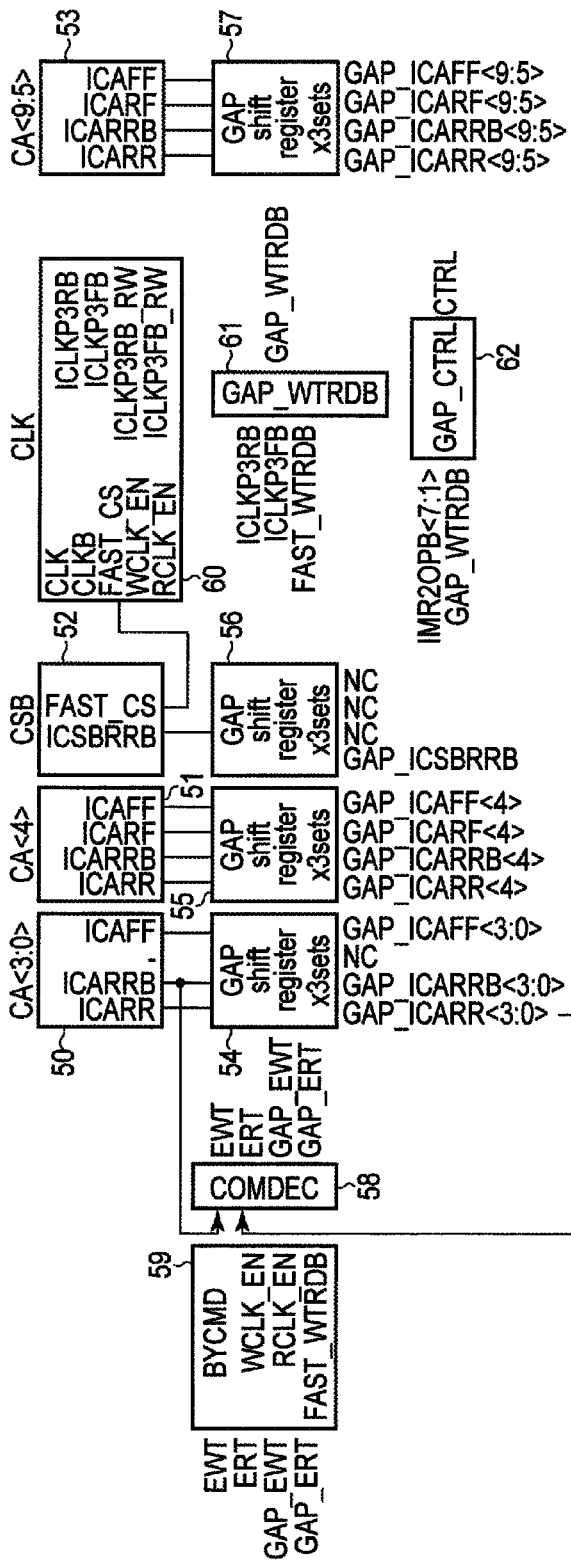
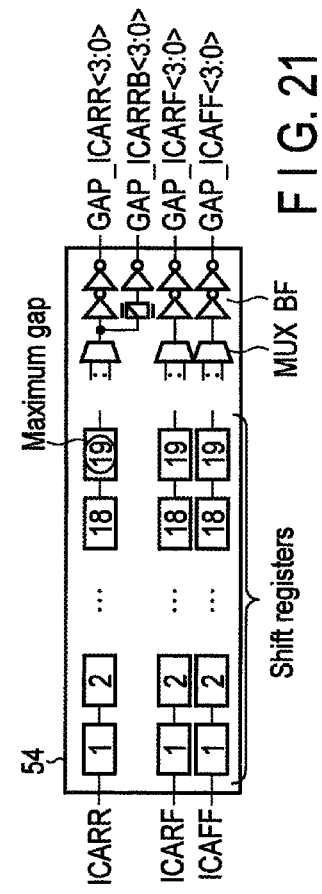
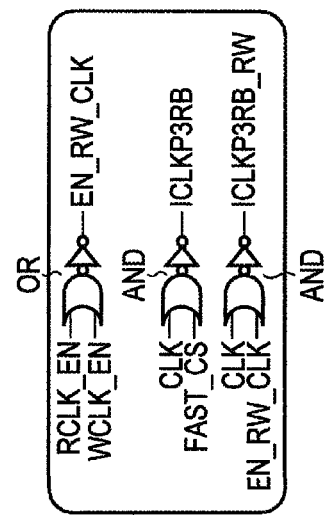
FIG. 19
FIG. 20
FIG. 21

| Signal | Module | | | |
|---|---|---|---|---|
| | BSCOMDEC_ALL (CMD) | IMRS_ALL (MR) | BXCTL_ALL (ROW) | BXBA_ALL (BANK) |
| ICARR<3:0> | ○ | | | |
| ICARRB<3:0> | ○ | | | |
| ICARF<9:4> | | ○ | | |
| ICAFF<9:0> | | ○ | | |
| ICARF<6:2> | | | ○ | |
| ICAFF<9:0> | | | ○ | |
| ICARR<4> | | | | ○ |
| IBAT<2:0> | | | | ○ |
| ICAFF<9:7> | | | | ○ |

For command   For address

<1:0> For mode register's command
<9:2> For MRW's OP <7:0>

F I G. 22

| Signal | Module | | | |
|---|---|---|---|---|
| | BSCOMDEC_ALL (CMD) | IMRS_ALL (MR) | BYADD (COL) | CRPT_UP_C (C1) |
| GAP_ICARR<3:0> | ○ | | | |
| GAP_ICARRB<3:0> | ○ | | | |
| GAP_ICARF<9:4> | | ○ | | |
| GAP_ICAFF<1:0> | | ○ | | |
| GAP_ICARF<9:3> | | | ○ | |
| GAP_ICAFF<5:0> | | | ○ | |
| GAP_ICARR<5> | | | | ○ |

For command    For address

F I G. 23

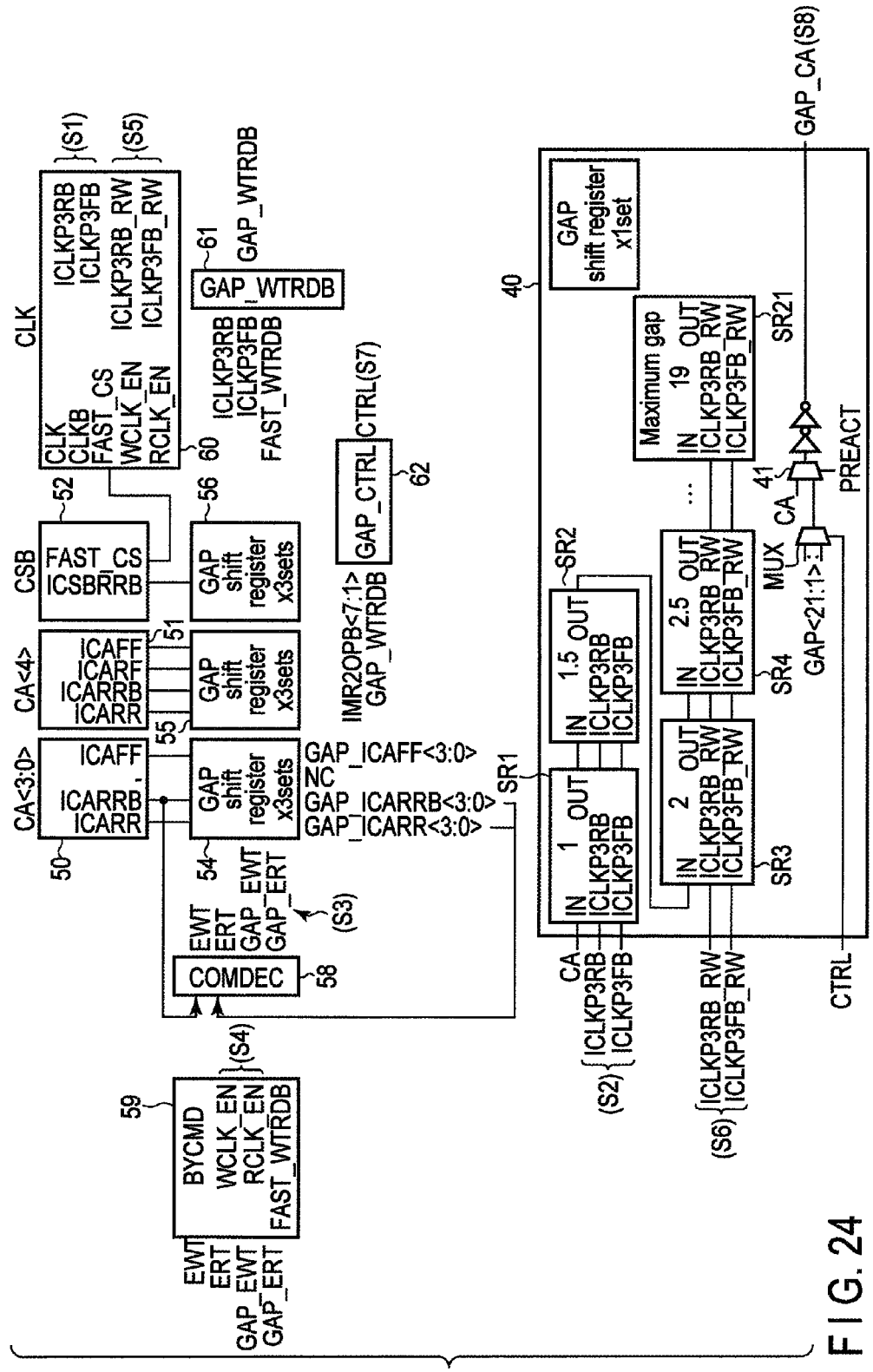
F I G. 24

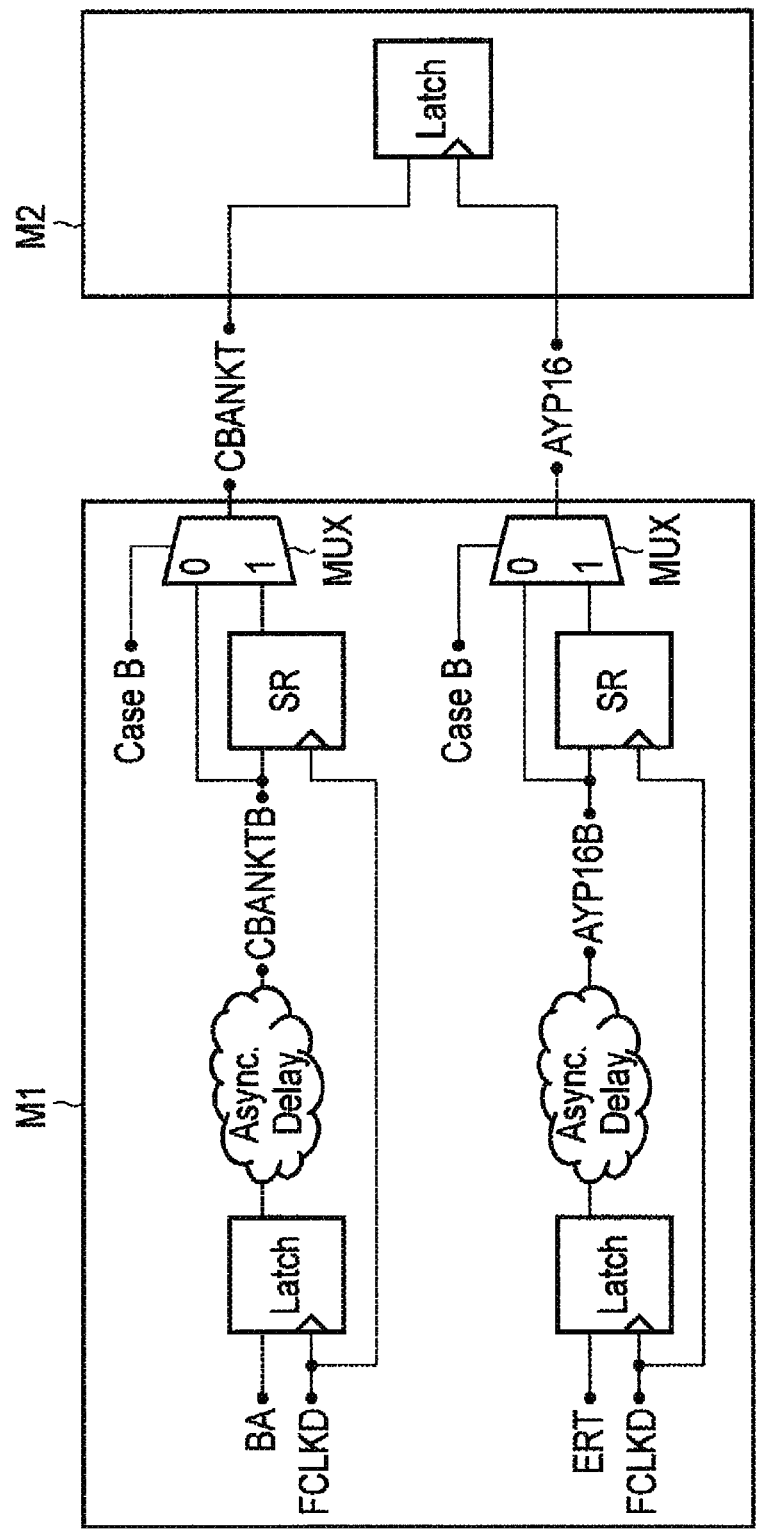
F I G. 25

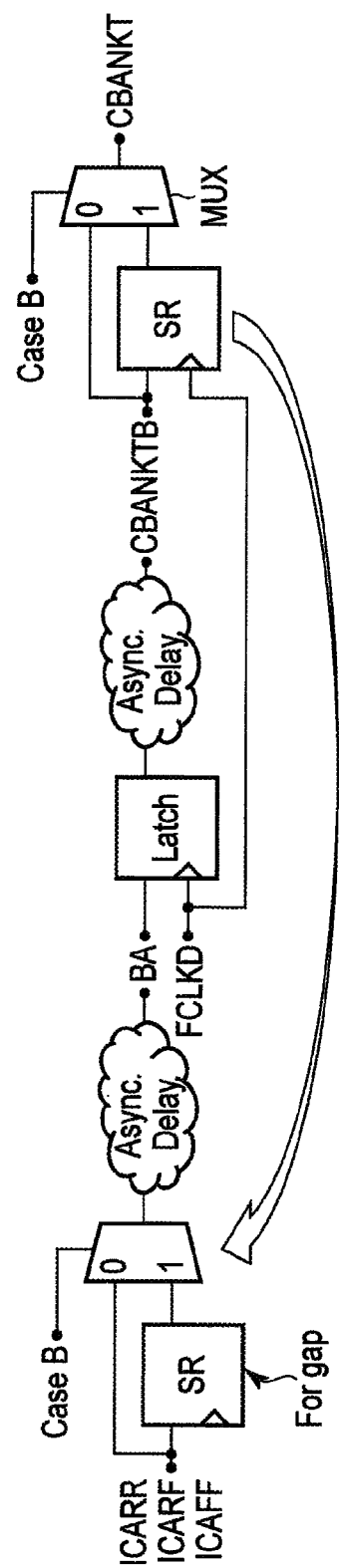
F I G. 26

FIG. 27

| CLK | CA0 | CA1 | CA2 | CA3 | CA4 | CA5 | CA6 | CA7 | CA8 | CA9 |
|---|---|---|---|---|---|---|---|---|---|---|
| ↑ | L | H | R8 | R9 | R10 | R11 | R12 | BA0 | BA1 | BA2 |
| ↓ | R0 | R1 | R2 | R3 | R4 | R5 | R6 | R7 | R13 | X |

Active

FIG. 28

For postactive ⇓

| CLK | CA0 | CA1 | CA2 | CA3 | CA4 | CA5 | CA6 | CA7 | CA8 | CA9 |
|---|---|---|---|---|---|---|---|---|---|---|
| ↑ | H | L | L/H | RFU | RFU | C1 | C2 | BA0 | BA1 | BA2 |
| ↓ | AP | C3 | C4 | C5 | C6 | C7 | R14 | R15 | R16 | R17 |

Read/write

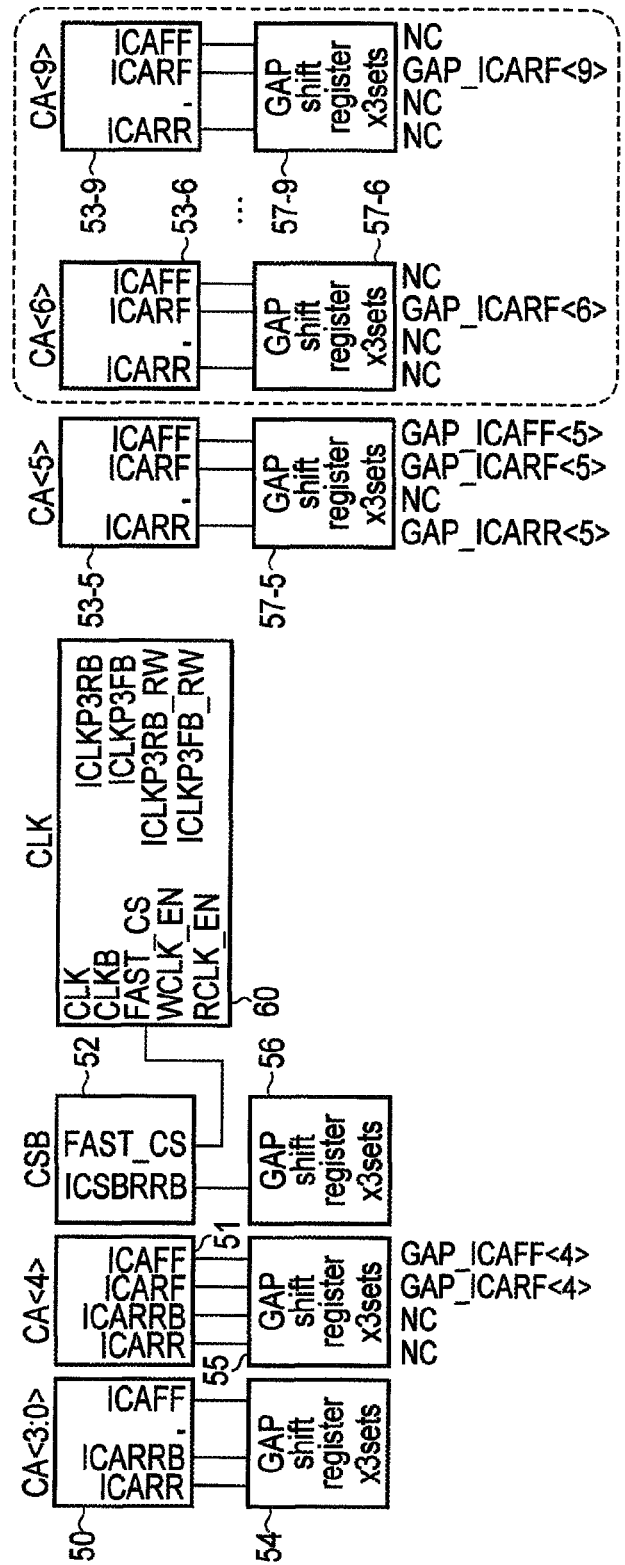
F I G. 29

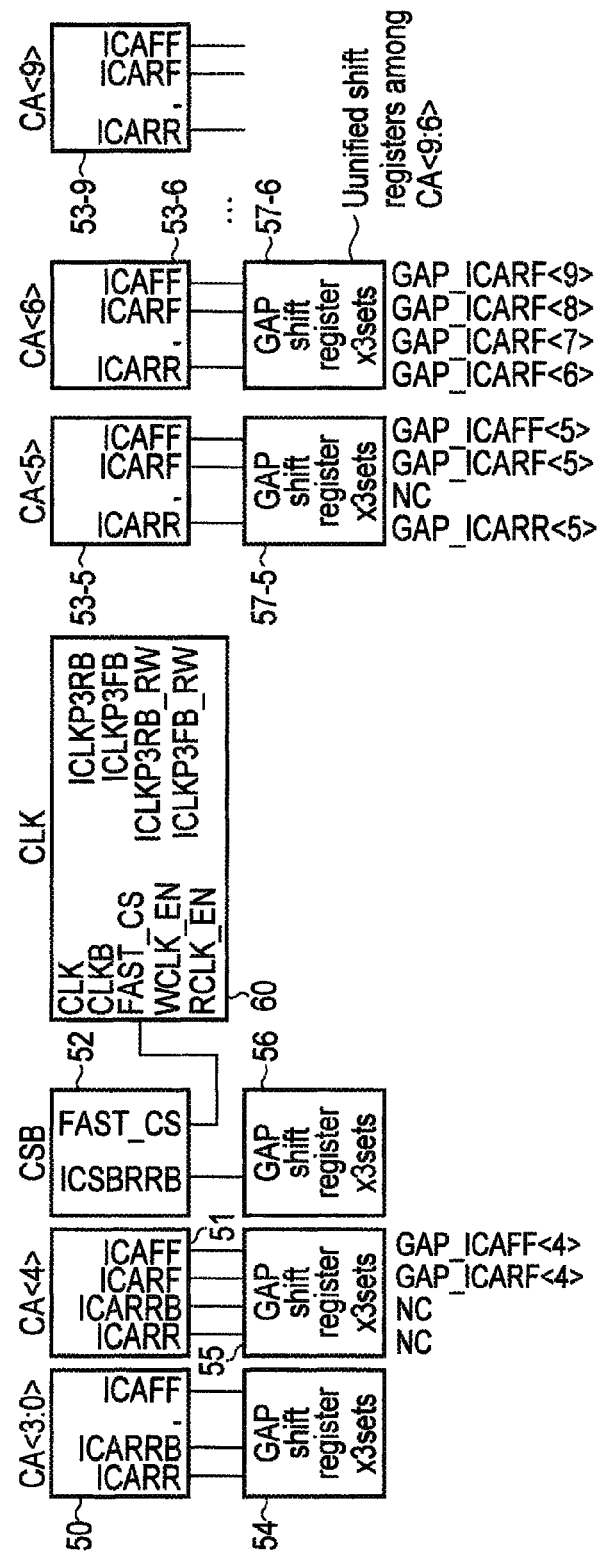
F I G. 30

| | DRAM | | Case A (PCG-ACT) | | Case B (ACT-R/W) | | Case A - Case B (GAP) | |
|---|---|---|---|---|---|---|---|---|
| MR2OP | RL | WL | RL | WL | RL | WL | RL | WL |
| 0001B | 3 | 1 | 3 | 2 | 9 | 7 | -6 | -5 |
| 0010B | 4 | 2 | 4 | 2 | 10 | 9 | -6 | -7 |
| 0011B | 5 | 2 | 5 | 2 | 13 | 12 | -8 | -10 |
| 0100B | 6 | 3 | 5 | 3 | 16 | 14 | -11 | -11 |
| 0101B | 7 | 4 | 6 | 3 | 19 | 17 | -13 | -14 |
| 0110B | 8 | 4 | 7 | 4 | 22 | 20 | -15 | -16 |
| 0111B | — | — | 8 | 4 | 25 | 23 | -17 | -19 |

| | DRAM | | Case A (PCG-ACT) | | Case B (ACT-R/W) | | Case A - Case B (GAP) | |
|---|---|---|---|---|---|---|---|---|
| MR2OP | RL | WL | RL | WL | RL | WL | RL | WL |
| 0001B | 3 | 1 | 3 | 2 | 9 | 8 | -6 | -6 |
| 0010B | 4 | 2 | 4 | 2 | 10 | 8 | -6 | -6 |
| 0011B | 5 | 2 | 5 | 2 | 13 | 10 | -8 | -8 |
| 0100B | 6 | 3 | 5 | 3 | 16 | 14 | -11 | -11 |
| 0101B | 7 | 4 | 6 | 3 | 19 | 16 | -13 | -13 |
| 0110B | 8 | 4 | 7 | 4 | 22 | 19 | -15 | -15 |
| 0111B | — | — | 8 | 4 | 25 | 21 | -17 | -17 |

SEMICONDUCTOR MEMORY DEVICE

CROSS-REFERENCE TO RELATED APPLICATIONS

This application is a Continuation of U.S. Ser. No. 14/864,271, filed Sep. 24, 2015, which is a Continuation of U.S. Ser. No. 14/201,686, now U.S. Pat. No. 9,171,600, filed Mar. 7, 2014, which claims the benefit of U.S. Provisional Application No. 61/873,800, filed Sep. 4, 2013, the entire contents of all of which are incorporated herein by reference.

FIELD

Embodiments described herein relate generally to a semiconductor memory device.

BACKGROUND

An MRAM (Magnetic Random Access Memory) is a memory device that uses a magnetic element having a magnetoresistive effect as a memory cell configured to store information, and has received a great deal of attention as a next-generation memory device featuring high-speed operation, large capacity, and nonvolatility. In addition, research and development is being conducted on MRAMs that replace a volatile memory such as a DRAM or an SRAM. In this case, the MRAMs are preferably operated by the same specifications as the DRAM or SRAM for development cost suppression and smooth replacement.

BRIEF DESCRIPTION OF THE DRAWINGS

FIG. 2 is a block diagram showing an example of a memory core and a peripheral circuit;

FIG. 4 is a timing chart concerning commands and addresses;

FIG. 5 is a view showing an example of a read latency and a write latency;

FIG. 15 is a view showing R2W and W2R in a plurality of modes;

FIG. 16 is a view for explaining parameters;

FIG. 17 is a view for explaining the minimum and maximum delay times of a signal WTRDB;

FIG. 19 is a block diagram showing an example of a circuit arrangement including gap shift registers;

FIG. 20 is a circuit diagram of a clock generator;

FIG. 21 is a circuit diagram of a gap delay circuit shown in FIG. 19;

FIG. 22 is a view for explaining ICA assignment for a row-related signal;

FIG. 23 is a view for explaining ICA assignment for a column-related signal;

FIG. 24 is a view for explaining the sequence of an operation according to an example;

FIG. 25 is a schematic view for explaining the layout of shift registers SR according to a comparative example;

FIG. 26 is a schematic view for explaining the layout of shift registers SR according to an example;

FIG. 27 is a view for explaining command/address assignment concerning an active command according to the second embodiment;

FIG. 28 is a view for explaining command/address assignment concerning a read/write command;

FIG. 29 is a block diagram showing the arrangement of shift registers according to a comparative example;

FIG. 30 is a block diagram showing the arrangement of shift registers according to an example;

DETAILED DESCRIPTION

Figure 1:
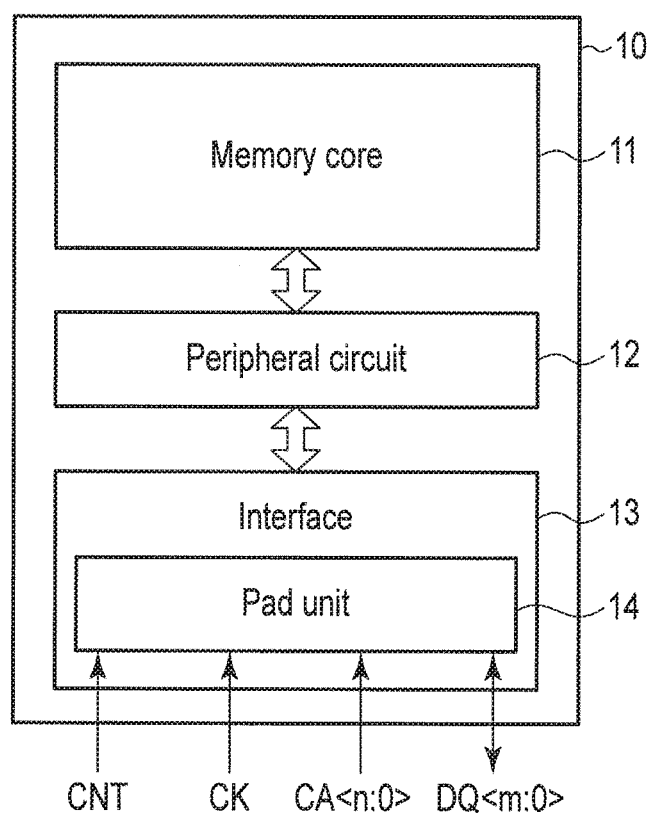
FIG. 1 is a schematic view of a semiconductor memory device according to the first embodiment.

In general, according to one embodiment, there is provided a semiconductor memory device capable of executing a first mode having a first latency and a second mode having a second latency longer than the first latency, comprising:

a pad unit configured to receive an address and a command from an outside;

a first delay circuit configured to delay the address by a time corresponding to the first latency;

a second delay circuit including shift registers connected in series and configured to delay the address by a time corresponding to a difference between the first latency and the second latency; and a controller configured to use the first delay circuit and the second delay circuit when executing the second mode.

Embodiments of the present invention will now be described with reference to the accompanying drawings. Note that in the following explanation, the same reference numerals denote elements having the same functions and arrangements, and a repetitive explanation will be made only when necessary.

In this embodiment, an MRAM (Magnetic Random Access Memory) will be exemplified as a semiconductor memory device.

First Embodiment

1. Overall Arrangement of Semiconductor Memory Device

FIG. 1 is a schematic view of a semiconductor memory device 10 according to this embodiment. The semiconductor memory device 10 includes a memory core 11, a peripheral circuit 12, and an interface 13.

The memory core 11 includes a plurality of memory cells configured to store data. The peripheral circuit 12 writes/reads data to/from the memory core 11.

The interface 13 includes a pad unit 14 configured to receive commands, addresses, data, and the like. The pad unit 14 includes a plurality of pads. The interface 13 receives a control signal CNT for read/write and a clock CK that controls the read/write operation timing from an external device (host) via the pad unit 14. The interface 13 is connected to the host via the pad unit 14 by a command/address line CA<n:0> and a data line DQ<m:0>, where n and m are natural numbers.

The control signal CNT includes a clock enable signal CKE and a chip select signal CS. The clock CK is used to control the operation timing of the semiconductor memory device 10. The command/address line CA<n:0> is used to transmit/receive commands and addresses. The data line DQ<m:0> is used to transmit/receive input data and output data.

FIG. 2 is a block diagram showing an example of the memory core 11 and the peripheral circuit 12. The memory core 11 includes a memory cell array unit 21, a row decoder 22, and a column decoder 23. The memory cell array unit 21 includes (k+1) banks BK0 to BKk, where k is a natural number. The banks BK0 to BKk can independently be activated. For example, when only a necessary bank is activated at the time of read/write, the power consumption can be reduced.

The row decoder 22 decodes, for example, a bank address BA<x:0> that selects one of the banks BK0 to BKk and a row address AR<y:0> that selects a row in the selected bank.

The column decoder 23 decodes, for example, a column address AC<z:0> that selects a column in the memory cell array unit 21.

The peripheral circuit 12 includes a command/address latch circuit 24, a control circuit (controller) 25, an address latch circuit 26, a data latch circuit 27, and a clock generator 28.

The command/address latch circuit 24 receives a command CMD and an address ADD from a host 15 via the command/address line CA<n:0>, and temporarily stores them. The command CMD is sent to the control circuit 25. The control circuit 25 controls the internal operation of the semiconductor memory device 10 based on the control signal CNT and the command CMD from the host 15.

Out of the address ADD, the bank address BA<x:0> is sent to the row decoder 22, the row address AR<y:0> is sent to the address latch circuit 26, and the column address AC<z:0> is sent to the column decoder 23.

In this embodiment, when a first command (for example, active command) is input, the address latch circuit 26 latches part of the full row address, as will be described later. The remaining part of the full row address is latched by the address latch circuit 26 in advance when a first command (for example, precharge command) input before the first command is input.

As described above, part of the row address is input in advance before input of the first command. This makes it possible to, for example, incorporate the semiconductor memory device in a system without increasing the number of pins or lowering the operation speed, that is, without changing the specifications even when the number of bits of the row address to select a word line (row) in the memory cell array unit 21 increases.

Note that the precharge command is a command to set a selected bank in an initial state (precharged state) for a read operation or a write operation, and more specifically, inactivates all word lines, all bit lines, and all source lines. The active command is a command to activate one of the plurality of word lines in a selected bank and perform processing of reading data from the memory cell array.

The data latch circuit 27 temporarily stores data input from the host 15 via the data line DQ<m:0> or output data read from a selected bank. The input data is written to the selected bank.

The clock generator 28 generates an internal clock CLK based on the clock CK from the host 15. The internal clock CLK is input to the command/address latch circuit 24, the control circuit 25, the address latch circuit 26, and the data latch circuit 27 and used to control their operation timings.

Figure 3:
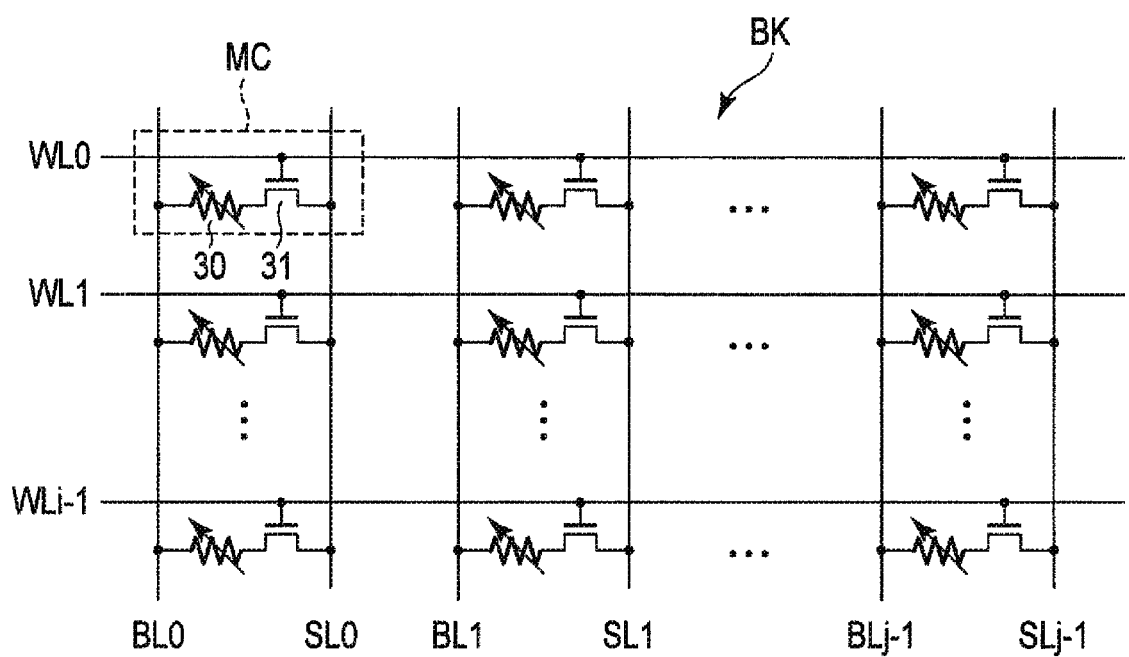
FIG. 3 is a circuit diagram of a memory cell array included in one bank.

FIG. 3 is a circuit diagram of the memory cell array included in one bank. The memory cell array is formed by arraying a plurality of memory cells MC in a matrix. A plurality of word lines WL0 to WLi-1, a plurality of bit lines BL0 to BLj-1, and a plurality of source lines SL0 to SLj-1 are disposed in the memory cell array. One row of the memory cell array is connected to one word line WL. One column of the memory cell array is connected to each pair of a bit line BL and a source line SL.

The memory cell MC includes a magnetoresistive element (MTJ (Magnetic Tunnel Junction) element) 30 and a select transistor 31. The select transistor 31 is formed from, for example, an n-MOSFET.

One terminal of the MTJ element 30 is connected to the bit line BL, and the other terminal is connected to the drain of the select transistor 31. The gate of the select transistor 31 is connected to the word line WL, and the source is connected to the source line SL.

2. Read/Write Latency

FIG. 4 is a timing chart concerning commands and addresses. FIG. 4 illustrates the timing charts of general semiconductor memory devices (for example, DRAM, MRAM (case A), and MRAM (case B)). PCG represents a precharge command; ACT, an active command; R/W, a read/write command; tRCD (RAS to CAS delay), a delay time from active command reception to read/write command reception; RAS, a row address strobe; CAS, a column address strobe; and RL/WL, a read/write latency. The read latency is a time necessary for read data to appear in the local interface after the start of a read request. The write latency is a time necessary for write data to appear in the local interface after the start of a write request. iR/iW indicates the read/write operation (internal read/write operation) in the MRAM.

In the DRAM shown in FIG. 4, a row address R has, for example, 17 bits (R<16:0>). The row address R<16:0> is input together with the active command and set in the DRAM.

In the MRAM (case A) shown in FIG. 4, the row address R has, for example, 18 bits (R<17:0>). The MRAM has a large page size as compared to, for example, the DRAM. For this reason, the row address is divided (for example, divided into upper bits R<17:14> and lower bits R<13:0>) and input twice. A precharge operation is designated by the rising edge of the clock when the precharge command is input, and a preactive operation is designated by the falling edge. That is, the precharge command can set the precharge operation and the preactive operation. In the preactive operation, the upper row address R<17:14> is input and set in the MRAM. In addition, an active operation is designated by the rising edge and falling edge of the clock when the active command is input. In the active operation, the lower row address R<13:0> is input and set in the MRAM.

In the MRAM (case B) shown in FIG. 4, an active operation is designated by the rising edge and falling edge of the clock when the active command is input. In the active operation, the lower row address R<13:0> is input and set in the MRAM. In addition, a read/write operation is designated by the rising edge of the clock when the read/write command is input, and a postactive operation is designated by the falling edge. That is, the read/write command can set the read/write operation and the postactive operation. In the postactive operation, the upper row address R<17:14> is input and set in the MRAM.

FIG. 5 is a view showing an example of the read latency and the write latency. FIG. 5 shows latencies in a plurality of modes (to be referred to as a mode MR2OP). The DRAM complies with JEDEC. The unit of latency is one clock cycle (1 tCK). The latency of the MRAM (case B) is obtained by adding the internal tRCD of the MRAM (case B) to the latency of the MRAM (case A).

Figure 6:
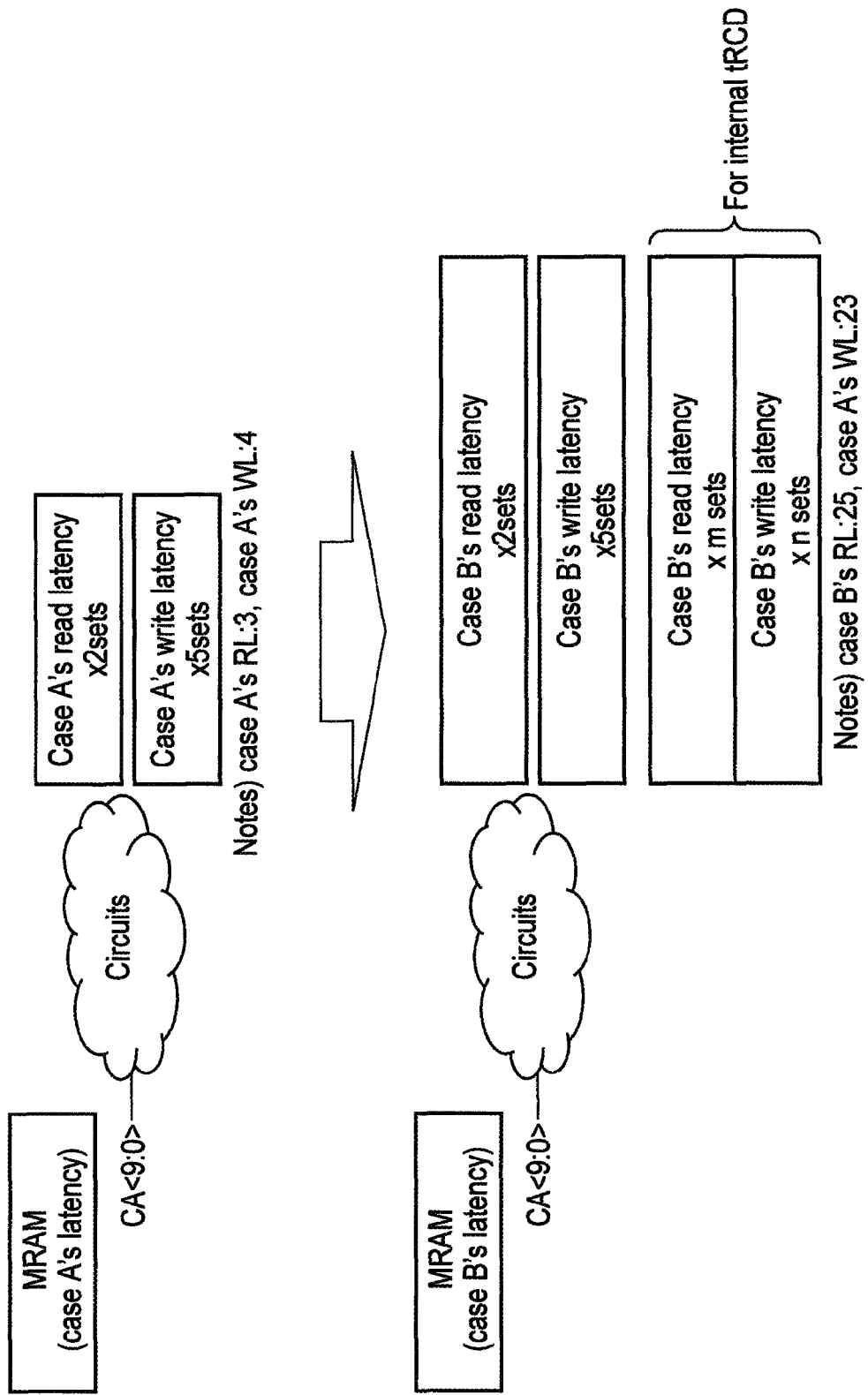
FIG. 6 is a view for explaining an example of the number of shift registers for latency.

FIG. 6 is a view for explaining an example of the number of shift registers for latency. A case A's read latency RL is, for example, 3 tCK, and a write latency WL is, for example, 4 tCK. The case A needs, for example, two sets of a plurality of shift registers for read latency and, for example, five sets of a plurality of shift registers for write latency.

A case B's read latency RL is, for example, 25 tCK, and the write latency WL is, for example, 23 tCK. In the case B, shift registers corresponding to the internal tRCD are added in each of the read latency and the write latency. For this reason, the case B needs a plurality of shift registers for internal tRCD in addition to the same shift register sets as in the case A.

Figure 7:
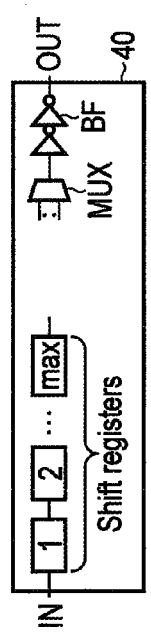
FIG. 7 is a circuit diagram of a delay circuit for latency.

FIG. 7 is a circuit diagram of a delay circuit 40 for latency. The delay circuit 40 includes an input terminal IN, a plurality of shift registers configured to delay a signal by a predetermined time, a multiplexer MUX, a buffer BF, and an output terminal OUT. One shift register delays a signal by, for example, one clock cycle (1 tCK). In the delay circuit 40, a plurality of shift registers corresponding to the maximum delay time are prepared. The multiplexer MUX selects a predetermined number of shift registers to be used in correspondence with the delay time of the signal line to which the delay circuit 40 is connected.

Figure 8:
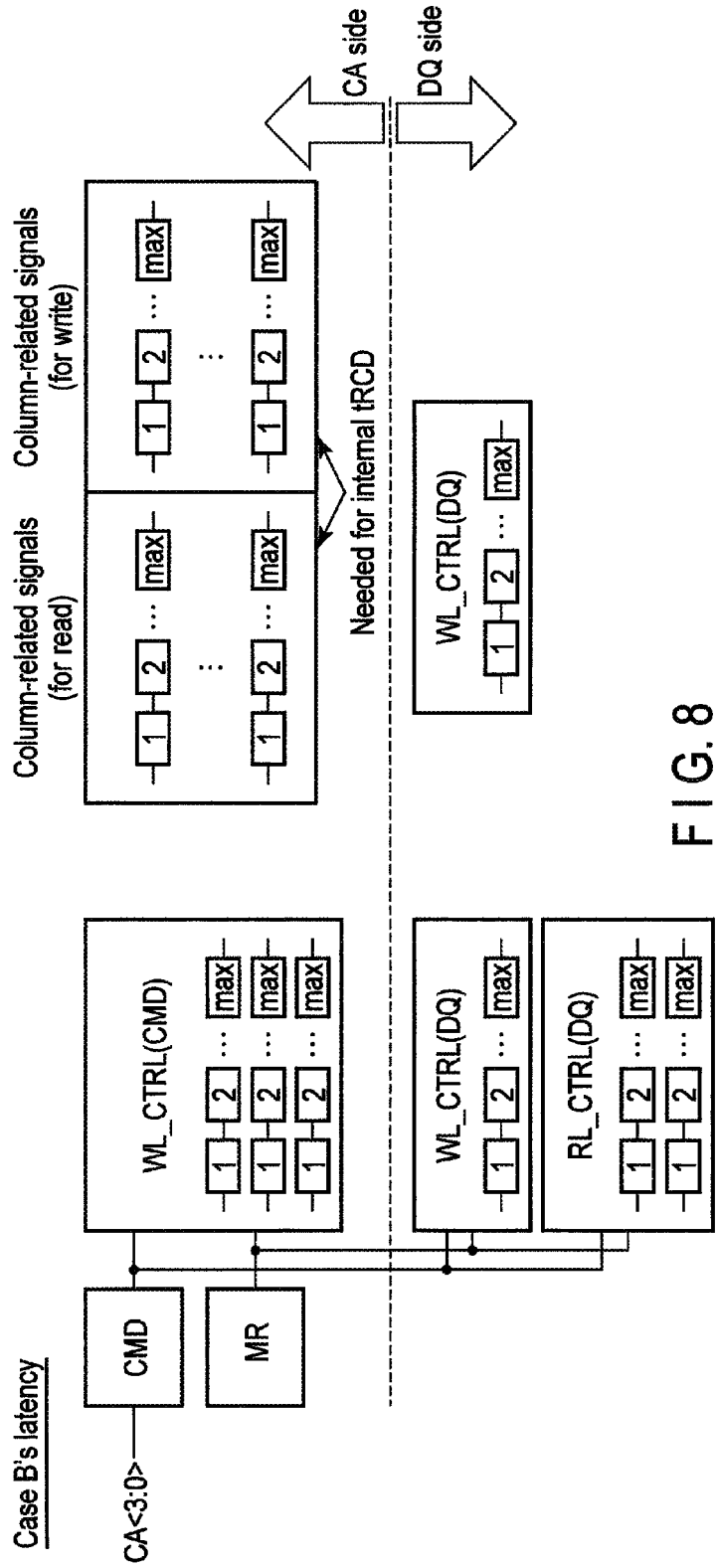
FIG. 8 is a view for explaining shift registers for case B's latency.

FIG. 8 is a view for explaining shift registers for case B's latency. Note that FIG. 8 illustrates shift registers corresponding to a further increase from the original shift registers (delay circuit). Five sets of shift registers are prepared in a write latency control unit WL_CTRL. Two sets of shift registers are prepared in a read latency control unit RL_CTRL. Additionally, for a plurality of column-related signals, a plurality of sets of shift registers configured to delay a signal by a time corresponding to the internal tRCD are prepared. As shown in FIG. 8, the case B needs more shift registers in addition to the original shift registers (delay circuit).

3. Example

Figures 9, 10:
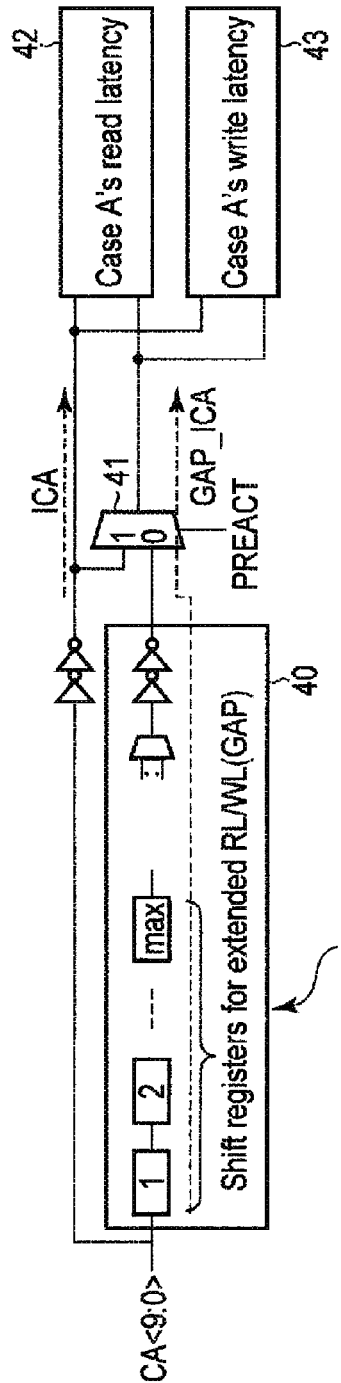
FIG. 9 is a view for explaining the latency gap between a case A and the case B.
FIG. 10 is a view for explaining the concept of the first embodiment.

FIG. 9 is a view for explaining the latency gap between the case A and the case B. The latency gap between the case A and the case B is obtained by subtracting the case B's latency from the case A's latency. That is, the latency gap between the case A and the case B corresponds to the internal tRCD for the case B.

FIG. 10 is a view for explaining the concept of this embodiment. Two paths ICA and GAP_ICA are prepared between the command/address pad CA<9:0> and a case A's read latency delay circuit 42.

The delay circuit 40 for latency gap shown in FIG. 9 is connected to the path GAP_ICA via the multiplexer MUX. The two paths ICA and GAP_ICA are connected to the multiplexer MUX. A signal PREACT is input to the control terminal of the multiplexer MUX. The signal PREACT=H corresponds to the case A (preactive operation), and the signal PREACT=L corresponds to the case B (postactive operation). In the example of FIG. 9, the maximum of one set of shift registers is 19.

In the case A (PREACT=H), the delay circuit 40 is not connected to the path GAP_ICA, and no latency gap is added (the latency is set to the same as in the path ICA). In the case B (PREACT=L), the delay circuit 40 is connected to the path GAP_ICA, and the latency gap is added. Note that a write latency delay circuit 43 also has the same arrangement as the read latency delay circuit 42.

Figure 11:
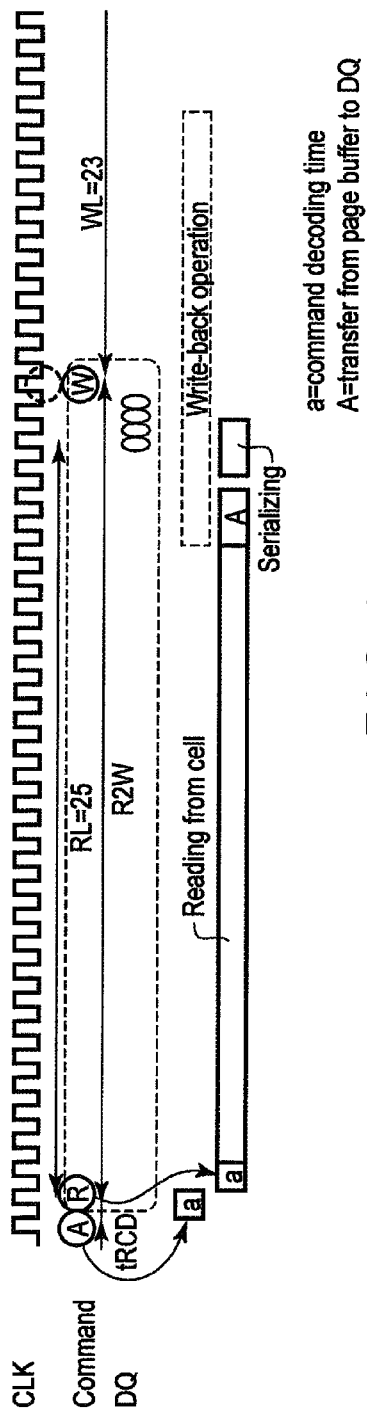
FIG. 11 is a timing chart showing a read-to-write operation according to a comparative example.

FIG. 11 is a timing chart showing a read-to-write operation according to a comparative example. In the explanation of commands in FIG. 11, A is the active command, R is the read command, and W is the write command. tWR is a write recovery time. In the comparative example, the read operation and the write operation are separately performed.

R2W is the time from the read command to the write command and is given by $$R2W = RL + tDQSCK + BL/2 + 1$$

where RL is the read latency, BL is the burst length, and tDQSCK is the DQS (data strobe) output access time from CLK.

Figure 12:
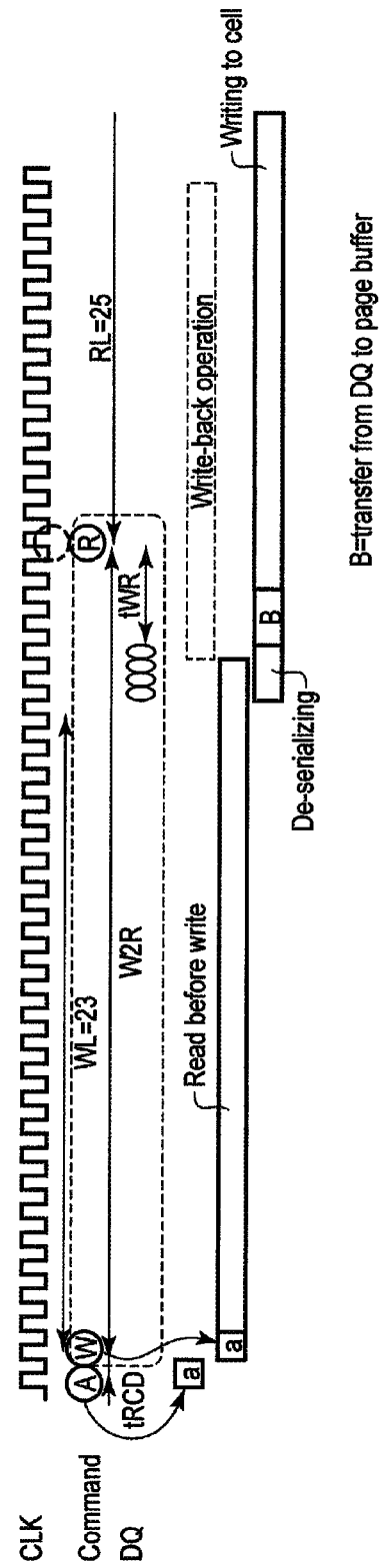
FIG. 12 is a timing chart showing a write-to-read operation according to the comparative example.

FIG. 12 is a timing chart showing a write-to-read operation according to the comparative example. W2R is the time from the write command to the read command and is given by $$W2R = WL + 1 + BL/2 + tWTR/tCK$$

where WL is the write latency, tWTR is the internal write to read command delay, and tCK is the clock cycle.

Figure 13:
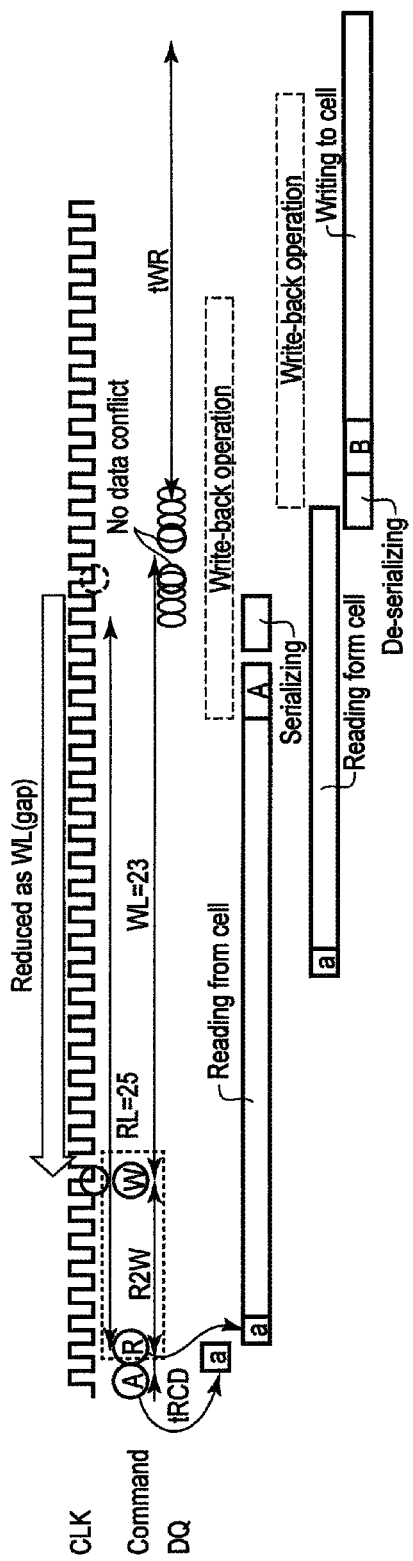
FIG. 13 is a timing chart showing a read-to-write operation according to an example.

FIG. 13 is a timing chart showing a read-to-write operation according to an example. In this example, the read operation and the write operation can parallelly be performed. R2W is given by $$R2W = RL - \{WL - (BL/2 + 1) - tDQSCKmax/tCK\} \quad (1)$$

Figure 14:
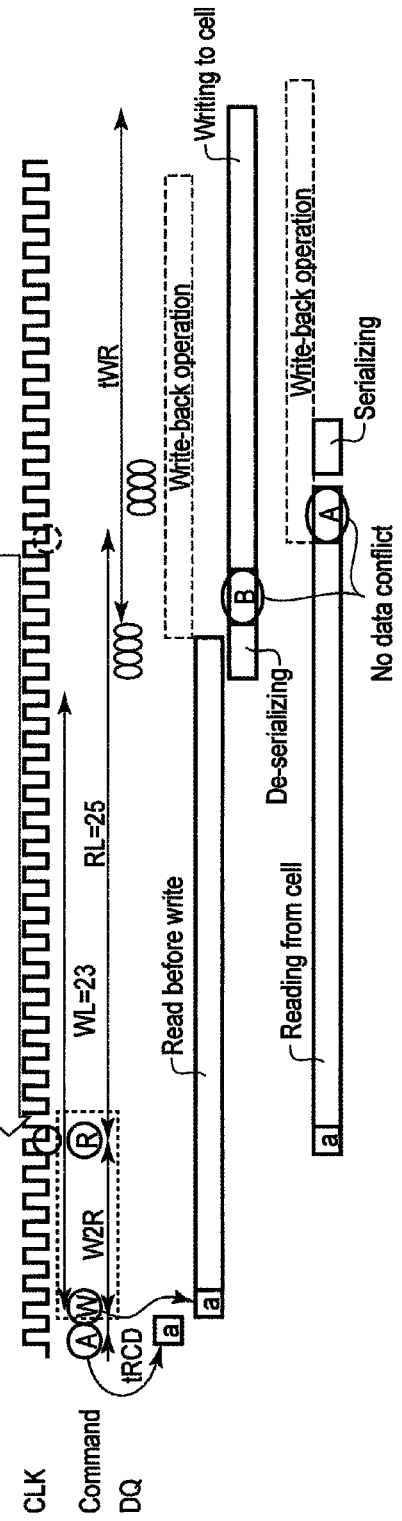
FIG. 14 is a timing chart showing a write-to-read operation according to an example.

FIG. 14 is a timing chart showing a write-to-read operation according to an example. W2R is given by $$W2R = WL(@case\ A) + 1 + BL/2 + tWTR/tCK \quad (2)$$

The column-related signal is used in both the read operation and the write operation. In the comparative example, since the read operation and the write operation are separately performed, the read latency and the write latency are ORed. On the other hand, when a long latency in which the read latency and the write latency overlap is necessary, as in the example, to commonly use latency gap control in read and write, a signal WTRDB representing the state of read and write is used to control the delay circuit 40 as well. In the write state (write operation), the signal WTRDB is set to a high level. In the read state (read operation), the signal WTRDB is set to a low level.

FIG. 15 is a view for explaining R2W and W2R in a plurality of modes. GAP_RL is a value obtained by subtracting case A's RL from case B's RL. GAP_WL is a value obtained by subtracting case A's WL from case B's WL. FIG. 16 is a view for explaining parameters tDQSCKmax/tCK and tWTR when the clock cycle tCK is changed. For example, BL=4, and tCK=1.875. R2W is calculated using equation (1), and W2R is calculated using equation (2).

FIG. 17 is a view for explaining the minimum (min) and maximum (max) delay times of the signal WTRDB. The offset, min, and max are given by

OFFSET=W2R−(|GAP_WL|−|GAP_RL|)

min=|GAP_RL|−OFFSET+1 max=|GAP_RL|−1

To obtain min, the distance from max is calculated to decide min. The signal WTRDB is created based on a read signal. For this reason, W2R is the same as in the write state in the vertical direction. Since GAP_RL and GAP_WL are different, the difference is subtracted from W2R. The offset value is subtracted from GAP_RL serving as the reference. In this case, the value is +1 because GAP_RL is also included.

To obtain max, when the read state is focused because the signal WTRDB is created based on the read signal, it is found that the latency of W2R matches the cycle of the signal WTRDB. For this reason, max is |GAP_RL|. However, the value is −1 in consideration of the transfer time of the internal signal.

Figure 18:
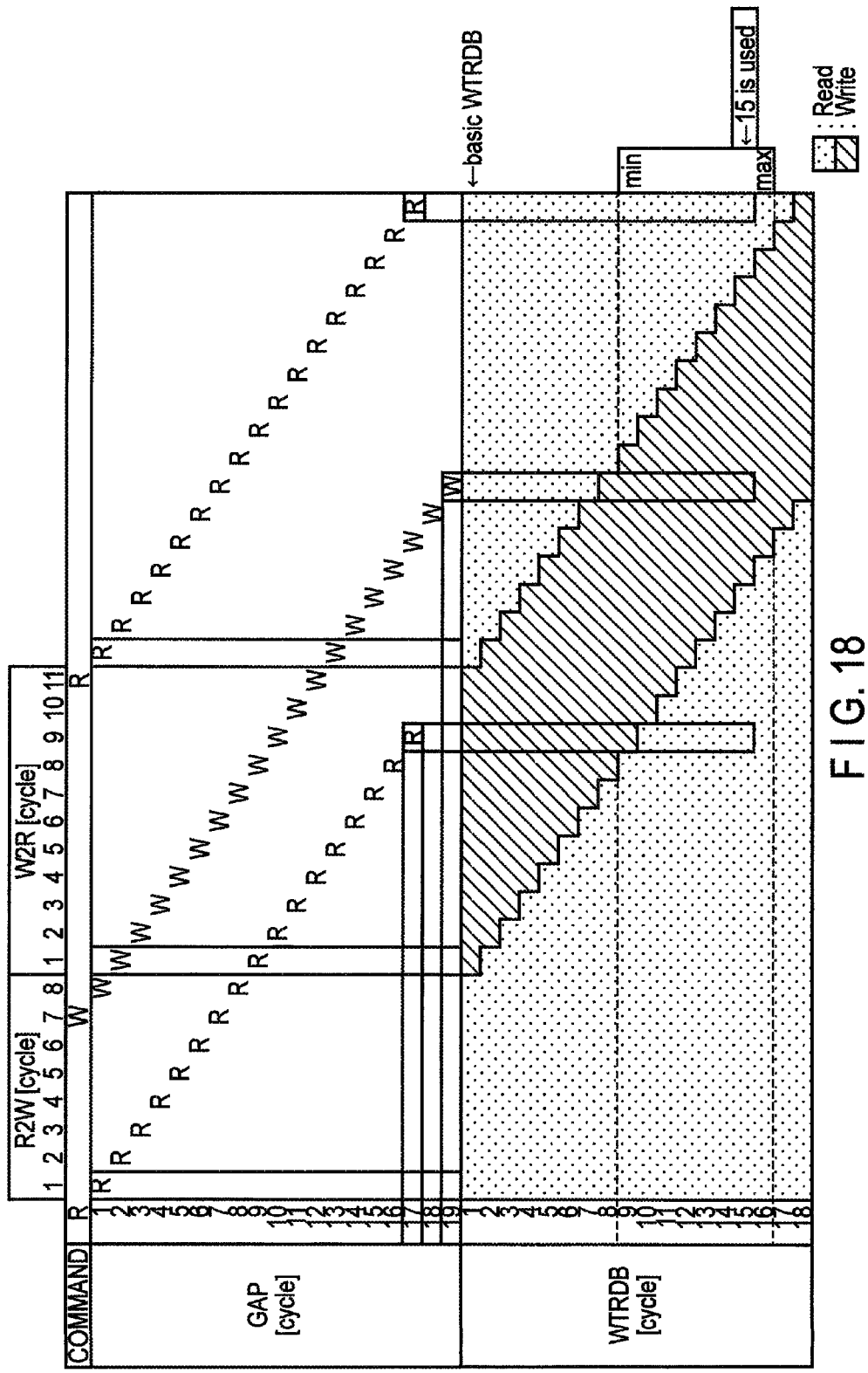
FIG. 18 is a view for explaining the delay time of the signal WTRDB.

FIG. 18 is a view for explaining the delay time of the signal WTRDB. In FIG. 18, the abscissa represents the command interval, and the ordinate represents the latency gap (number of shift registers). The delay time of the signal WTRDB from the reference is set within the range between min and max in FIG. 18. This makes it possible to commonly use the signal WTRDB in the read operation and the write operation by controlling the delay circuit 40 for the gap using the delayed signal WTRDB even when the read latency and the write latency overlap.

4. Example of Circuit Arrangement

A detailed example of a circuit arrangement will be described next. FIG. 19 is a block diagram showing an example of a circuit arrangement including gap shift registers. NC in FIG. 19 indicates no connection.

A latch circuit 50 latches a signal from a command/address pad CA<3:0>. A latch circuit 51 latches a signal from a command/address pad CA<4>. A latch circuit 52 latches the chip select signal from a chip select pad CSB. A latch circuit 53 latches a signal from a command/address pad CA<9:5>. The outputs from the latch circuits 50 to 53 are connected to the inputs to gap delay circuits 54 to 57, respectively. Signals ICARR, ICARF, and ICAFF are signals input from the corresponding pads. Only the timings at which the signals are received by the latch circuits are different. A signal ICARRB is the inverted signal of the signal ICARR.

A command decoder 58 decodes the write command and the read command input from the latch circuit 50, and generates signals EWT and ERT. The command decoder 58 also decodes the write command and the read command input from the gap delay circuit 54, and generates signals GAP_EWT and GAP_ERT. A signal generation circuit 59 receives the signals from the command decoder 58, and generates signals WCLK_EN, RCLK_EN, and FAST_WTRDB. The signal FAST_WTRDB is generated using the signals EWT and ERT. The signal WCLK_EN is generated using the signal GAP_EWT. The signal RCLK_EN is generated using the signal GAP_ERT.

A clock generator 60 generates various kinds of clocks. FIG. 20 is a circuit diagram of the clock generator 60. As shown in FIG. 20, the signals WCLK_EN and RCLK_EN are ORed to obtain a signal EN_RW_CLK. The clock CLK and a signal FAST_CS are ANDed to obtain a clock ICLKP3RB. The clock CLK and the signal EN_RW_CLK are ANDed to obtain a clock ICLKP3RB_RW.

A signal generation circuit 61 receives the clocks ICLKP3RB and ICLKP3FB and the signal FAST_WTRDB, and generates a signal GAP_WTRDB. A gap delay circuit 62 receives a mode signal IMR2OPB<7:1> and the signal GAP_WTRDB, and generates a signal CTRL by delaying the signal GAP_WTRDB by a predetermined time in accordance with the mode signal IMR2OPB<7:1>. The time to delay the signal GAP_WTRDB is decided based on FIG. 18. The gap delay circuit 62 is formed from a plurality of shift registers connected in series.

Note that in FIG. 19, the latch circuits 50 to 53 and the gap delay circuits 54 to 57 are included in, for example, the interface 13 shown in FIG. 1. The command decoder 58, the signal generation circuits 59 and 61, and the gap delay circuit 62 are included in, for example, the control circuit 25 shown in FIG. 2. The clock generator 60 is included in, for example, the clock generator 28 shown in FIG. 2.

FIG. 21 is a circuit diagram of the gap delay circuit 54 shown in FIG. 19. The gap delay circuit 54 includes three sets of shift registers. Each set has the same arrangement as that of the basic delay circuit 40 shown in FIG. 7. Each set includes shift registers as many as the maximum number of gaps. The gap delay circuits 55 to 57 also have the same arrangement as the gap delay circuit 54.

FIG. 22 is a view for explaining ICA assignment for a row-related signal. FIG. 23 is a view for explaining ICA assignment for a column-related signal. CMD is a command, and MR is a mode register. A signal MRW's OP<7:0> indicates the option of mode register write. C1 is a signal used to change the order of signals.

As the row-related signal in FIG. 22, the signal of the command/address pad <9:0> is used without using the gap shift registers. The column-related signal shown in FIG. 23 is a signal delayed by the delay time of the gap shift registers. As described above, in this embodiment, the operation concerning the row-related signal is controlled using the original signal (a signal that has not passed through the gap delay circuit). On the other hand, the operation concerning the column-related signal is controlled using the signal delayed by the gap delay circuit.

FIG. 24 is a view for explaining the sequence of an operation according to an example. FIG. 24 illustrates one set of delay circuit 40 included in the gap delay circuit 54 or 55.

When the signal FAST_CS is asserted, the clock generator 60 generates the clocks ICLKP3RB and ICLKP3FB (step S1). The signal FAST_CS is asserted when the chip select signal CSB is asserted. Shift registers SR1 and SR2 operate in accordance with the clocks ICLKP3RB and ICLKP3FB and delay the signal CA by 2 tCK (step S2).

Next, the command decoder 58 decodes the command (step S3). The signal generation circuit 59 generates the signals WCLK_EN, RCLK_EN, and FAST_WTRDB (step S4). The signal WCLK_EN is asserted when the signal GAP_EWT is asserted. The signal RCLK_EN is asserted when the signal RCLK_EN is asserted. Next, the clock generator 60 generates the clocks ICLKP3RB_RW and ICLKP3FB_RW when the signal WCLK_EN or RCLK_EN is asserted (step S5).

Shift registers SR3 to SR21 operate in accordance with the clocks ICLKP3RB_RW and ICLKP3FB_RW, and delay the signal by a predetermined time (step S6). In this embodiment, two kinds of clocks, ICLKP3RB and ICLKP3RB_RW, are supplied to the delay circuit 40. The shift registers SR3 to SR21 operate behind the shift registers SR1 and SR2. This makes it possible to ensure the margin of the setup time of the shift register SR1 at the first stage.

Subsequently, the gap delay circuit 62 generates the CTRL (step S7). The multiplexer MUX activates the latency path of the gap generated by the shift registers SR1 to SR21 when the signal CTRL is asserted. A multiplexer 41 selects the path of the multiplexer MUX when the signal PREACT=L (case B). The multiplexer 41 outputs, via the buffer, a signal GAP_CA to which the latency is added by the gap shift registers.

5. Layout of Shift Registers

An example of the arrangement concerning the layout of the gap shift registers when the specifications of both the case A and the case B are implemented in the semiconductor memory device 10 will be described next. The case A and the case B have different latencies.

FIG. 25 is a schematic view for explaining the layout of shift registers SR according to a comparative example. For example, signals CBANKT and AYP16 are sent from a module M1 to a module M2. The gap shift registers SR are inserted after asynchronous delay. The signal AYP16 of the case A has a delay time different from that of the signal CBANKT. The delay time difference indicates the setup margin of the module M2.

Since the signal AYP16 of the case B and the signal CBANKT of the case B are adjusted by a clock FCLKD at the last stage of the module M1, a loss corresponding to the gap of asynchronous delay occurs in the delay time. Hence, in the module M2, the setup margin of the latch circuit at the first stage decreases.

FIG. 26 is a schematic view for explaining the layout of the shift registers SR according to an example. The multiplexer and the gap shift registers configured to adjust the latencies of the plurality of signals ICARR, ICARF, and ICAFF are arranged together near the command/address pad CA. The gap shift registers can be operated using a clock different from the clock FCLKD. This can improve the setup margin.

6. Effects

When a long latency is necessary, a reference latency is created, and a delay circuit (including a plurality of shift registers) configured to generate a latency corresponding to the gap from the reference latency is arranged near the CA pad (stage before the command decoder). This makes it possible to decrease the number of shift registers used for latency on the whole chip.

When the signal WTRDB representing the state of read and write is similarly delayed by the delay circuit, the latency corresponding to the gap between read and write can commonly be used. This makes it possible to further decrease the number of shift registers used for latency.

Second Embodiment

Command/address assignment will be described first. FIG. 27 is a view for explaining command/address assignment concerning an active command. FIG. 28 is a view for explaining command/address assignment concerning a read/write command.

Referring to FIGS. 27 and 28, the arrows of a clock CLK indicate the rising edge and falling edge of the clock. CA0 to CA9 indicate commands and addresses input from a command/address pad (command/address line). A bank address BA that designates a bank includes, for example, 3 bits (BA0 to BA2). A row address R includes, for example, 18 bits (R0 to R17). Out of the full row address bits R0 to R17, a first row address (part of the full row address) input together with an active command includes, for example, the lower bits R0 to R13. Out of the full row address bits R0 to R17, a second row address (the remaining part of the full row address) input together with a read/write command includes, for example, the upper bits R14 to R17. A column address C includes, for example, 7 bits (C1 to C7).

Referring to FIG. 27, an active operation is designated by the rising edge and falling edge of the clock CLK when the active command is input. The active command asserts a chip select signal CS and is defined using CA0=L and CA1=H at the rising edge of the clock CLK. At the rising edge of the clock CLK, the row address bits R8 to R12 are input from the pads CA2 to CA6, and the bank address bits BA0 to BA2 are input from the pads CA7 to CA9. At the falling edge of the clock CLK, the row address bits R0 to R7 and R13 are input from the pads CA0 to CA8. "X" indicates "don't care".

Referring to FIG. 28, a read/write operation is designated by the rising edge of the clock CLK when the read/write command is input, and a postactive operation is designated by the falling edge of the clock CLK. That is, the read/write command can set the read/write operation and the postactive operation. The read command asserts the chip select signal CS and is defined using CA0=H, CA1=L, and CA2=L at the rising edge of the clock CLK. The write command asserts the chip select signal CS and is defined using CA0=H, CA1=L, and CA2=H at the rising edge of the clock CLK.

In the read/write operation, the column address bits C1 and C2 are input from the pads CA5 and CA6, and the bank address bits BA0 to BA2 are input from the pads CA7 to CA9.

In the postactive operation, the column address bits C3 to C7 are input from the pads CA1 to CA7, and the upper row address bits R14 to R17 are input from the pads CA6 to CA9. In FIG. 28, "RFU" indicates "reserved for future use", and "AP" is a flag that defines auto-precharge.

FIG. 29 is a block diagram showing the arrangement of shift registers according to a comparative example. Note that FIG. 29 shows details of the portion concerning the command/address pad CA<9:4>.

Delay circuits 57-5 to 57-9 are connected to latch circuits 53-5 to 53-9 for the command/address pads CA<5> to CA<9>. In the read/write operation, each of the delay circuits 57-5 to 57-9 handles only one signal, GAP_ICARF.

FIG. 30 is a block diagram showing the arrangement of shift registers according to an example. In this example, delay circuits for the signal GAP_ICARF<9:6> are unified among the command/address pads CA<5> to CA<9>. The unified delay circuit 57-6 includes four sets of shift registers for the signal GAP_ICARF<9:6>.

According to the second embodiment, as unnecessary shift registers can be eliminated, the area of the latency delay circuit can be reduced.

Third Embodiment

When a semiconductor memory device 10 includes a trimming circuit for latency, the trimming circuit needs to be inserted into each latency delay circuit in the arrangement of the comparative example shown in FIG. 8.

Figure 31:
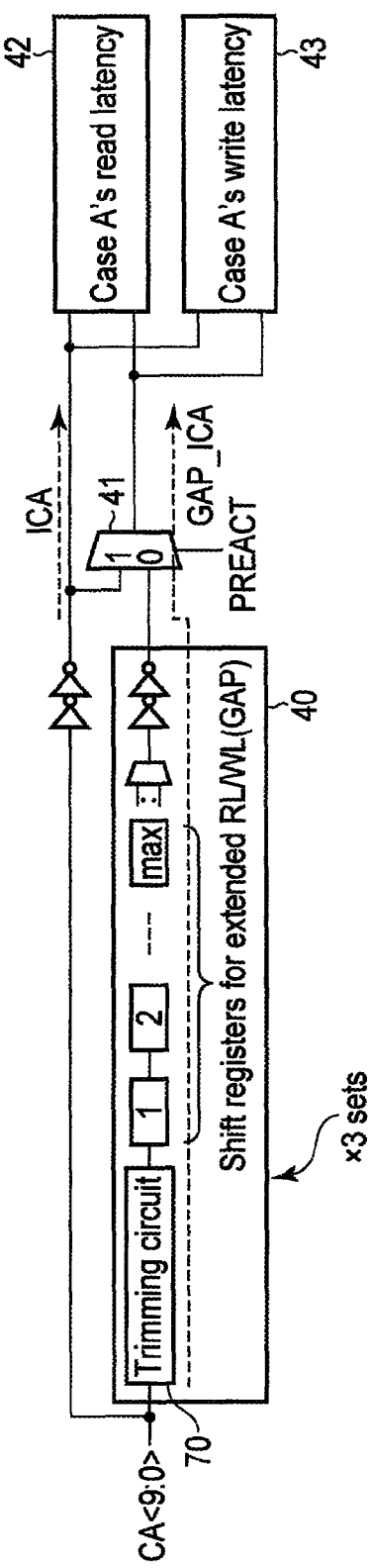
FIG. 31 is a circuit diagram of a delay circuit according to the third embodiment.

FIG. 31 is a circuit diagram of a delay circuit 40 according to the third embodiment. As described in the first embodiment, the delay circuits 40 for gap are arranged near a command/address pad CA<9:0> together. The delay circuit 40 includes a trimming circuit 70. The trimming circuit 70 has a function of adjusting the characteristic (for example, latency) of the semiconductor memory device 10.

According to the third embodiment, since the plurality of trimming circuits need not be dispersed, the number of trimming circuits can be decreased. It is therefore possible to reduce the area of the semiconductor memory device 10.

Fourth Embodiment

In the fourth embodiment, a method of relaxing the internal timing will be described. Referring to FIG. 9 described in the first embodiment, R2W (time from the read command to the write command) and W2R (time for the write command to the read command) change between the case A and the case B. Hence, the timing of the case A-B is preferably adjusted in accordance with the case A.

At the timing of the case B, R2W (time from the read command to the write command) and W2R (time for the write command to the read command) are adjusted by $$R2W = RL - \{WL - (BL/2+1) - tDQSCKmax/tCK\} + (|GAP\_WL| - |GAP\_RL|)$$

$$W2R = WL(@case\ A) + 1 + BL/2 + tWTR/tCK + (|GAP\_WL| - |GAP\_RL|)$$

The latencies calculated by these equations are implemented using shift registers. This makes it possible to relax the internal timing of the case B.

Figure 32:
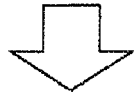
FIG. 32 is a view for explaining latencies according to the fourth embodiment.

As the method of relaxing the internal timing, a gap read latency and a gap write latency for gap may be set to the same value. FIG. 32 is a view for explaining the latencies. A gap read latency GAP_RL and a gap write latency GAP_WL are set to the same value. This obviates the necessity of discriminating the gap latency between read and write. It is therefore possible to control a delay circuit 40 without using a signal WTRDB representing the state of read and write.

Note that the MRAM described in the above embodiments may be a spin transfer torque magnetoresistive random access memory (STT-MRAM).

In the above embodiments, an MRAM using a magnetoresistive element has been exemplified as the semiconductor memory device. However, the present invention is not limited to this, and is applicable to various kinds of semiconductor memory devices without distinction between a volatile memory and a nonvolatile memory. The present invention is also applicable to a resistance change memory similar to the MRAM, for example, an ReRAM (Resistive Random Access Memory) or a PCRAM (Phase-Change Random Access Memory).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of controlling a magnetoresistive random access memory, comprising:
   receiving a plurality of first signals associated with an active state through command/address pins at a rising edge and a falling edge of a clock signal;
   receiving a plurality of second signals associated with a column address and a row address for a read operation, after receiving the plurality of first signals, through the command/address pins at a rising edge and a falling edge of the clock signal;
   reading data from at least one memory cell, in response to the plurality of second signals, according to the row address for the read operation;
   receiving a plurality of third signals associated with a column address and a row address for a write operation through the command/address pins at a rising edge and a falling edge of the clock signal, while reading the data from the at least one memory cell;
   outputting the data read from the at least one memory cell to data input/output pins, according to the column address for the read operation, after a lapse of a predetermined read latency from receiving the plurality of second signals;
   inputting data through the data input/output pins, in response to the plurality of third signals, according to the column address for the write operation, after a lapse of a predetermined write latency from receiving the plurality of third signals; and
   writing the data inputted from the data input/output pins to at least one memory cell according to the row address for the write operation.

2. The method according to claim 1, further comprising:
   reading data from the at least one memory cell to be written, in response to the plurality of third signals, before writing the data inputted from the data input/output pins to the at least one memory cell.

3. The method according to claim 1, wherein a timing of using the column address is delayed by a predetermined period in comparison with a timing of using the row address.

4. The method according to claim 3, wherein shift registers connected in series are used to generate the delay.

5. The method according to claim 1, wherein a period of the read latency and a period of the write latency are different from each other.

6. The method according to claim 5, wherein the period of the read latency is longer than the period of the write latency.

7. The method according to claim 1, wherein there is a time lag between outputting the data read from the at least one memory cell to the data input/output pins and receiving the data through the data input/output pins.

8. A method of controlling a magnetoresistive random access memory, comprising:
   receiving a plurality of first signals associated with an active state through command/address pins at a rising edge and a falling edge of a clock signal;
   receiving a plurality of second signals associated with a column address and a row address for a write operation, after receiving the plurality of first signals, through the command/address pins at a rising edge and a falling edge of the clock signal;
   receiving a plurality of third signals associated with a column address and a row address for a read operation, after receiving the plurality of second signals, through the command/address pins at a rising edge and a falling edge of the clock signal;
   reading data from at least one memory cell, in response to the plurality of third signals, according to the row address for the read operation;

inputting data through the data input/output pins, in response to the plurality of second signals, according to the column address for the write operation, after a lapse of a predetermined write latency from receiving the plurality of second signals;

outputting the data read from the at least one memory cell to data input/output pins, according to the column address for the read operation, after a lapse of a predetermined read latency from receiving the plurality of third signals; and writing the data inputted from the data input/output pins to at least one memory cell according to the row address for the write operation.

9. The method according to claim 8, further comprising:
reading data from the at least one memory cell to be written, in response to the plurality of second signals, before writing the data inputted from the data input/output pins to the at least one memory cell.

10. The method according to claim 8, wherein a timing of using the column address is delayed by a predetermined period in comparison with a timing of using the row address.

11. The method according to claim 10, wherein shift registers connected in series are used to generate the delay.

12. The method according to claim 8, wherein a period of the read latency and a period of the write latency are different from each other.

13. The method according to claim 12, wherein the period of the read latency is longer than the period of the write latency.

14. The method according to claim 8, wherein there is a time lag between receiving the data through the data input/output pins and outputting the data read from the at least one memory cell to the data input/output pins.

* * * * *